United States Patent [19]
Amao et al.

[11] Patent Number: 4,864,361
[45] Date of Patent: Sep. 5, 1989

[54] SCREEN PRINTING MACHINE

[75] Inventors: Kenji Amao, Chiyodamachi; Sadao Masuda, Menumamachi, both of Japan

[73] Assignee: Sanyo Electric Co., Ltd., Japan

[21] Appl. No.: 90,690

[22] Filed: Aug. 28, 1987

[30] Foreign Application Priority Data

Sep. 3, 1986 [JP] Japan ................................. 61-207389
Dec. 17, 1986 [JP] Japan ................................. 61-193936

[51] Int. Cl.⁴ ............................................. G03B 27/42
[52] U.S. Cl. ........................................ 355/53; 355/54; 355/72
[58] Field of Search ............................. 355/53, 54, 72

[56] References Cited

U.S. PATENT DOCUMENTS 3,950,095  4/1976  Bouygues et al. ..................... 355/53
4,432,635  2/1984  Mayer ................................... 355/30
4,505,580  3/1985  Michel .................................. 355/53
4,676,649  6/1987  Phillips ................................. 355/53

Primary Examiner—Monroe H. Hayes
Attorney, Agent, or Firm—Darby & Darby

[57] ABSTRACT

The present invention discloses a screen printing machine having a position adjusting means for carrying out adjustment of position of a material to be printed having a plurality of alignment marks in a direction of X, Y and θ. The adjusting means comprises a placing means for placing and positioning the material to be printed, a means for displacing the placing means in a direction of X and moving and carrying the placing means from a recognition station to a printing station, and a means for displacing the placing means in a directin of Y. The displacing means is composed of a mechanism in which both side portions of the placing means are respectively independently displaced in the direction of Y to make adjustment of positions of the placing means in the directions of Y and θ. The position adjusting means further comprises a recognition means for recognizing alignment marks marked on the material to be printed placed on the placing means and a displacement means for displacing the placing means in response to the recognition of the marks by the recognition means, the recognition means being moved in a direction at right angles to the carrying direction of the material to be printed.

2 Claims, 2 Drawing Sheets

SCREEN PRINTING MACHINE

BACKGROUND OF THE INVENTION

(1) Field of the Invention

The present invention relates to a screen printing machine which is used to print a wiring pattern or the like on a substrate, for example, such as a substrate for a thick film integrated circuit, a print substrate, etc., and more specifically, to an improvement in a screen printing machine comprising an adjusting means for a substrate position for preventing a dislocation of printing and a recognition means.

(2) Prior Art

In prior art, the adjustment of position of a substrate in a screen printing machine of this kind has been made by carrying out a rough positioning on the basis of an end face of the substrate or a hole made in the substrate, thereafter causing the substrate to be attracted to an attraction table, and displacing the attraction table in a direction of X, Y and $\theta$, thus achieving the adjustment of position with high accuracy. Specifically, a substrate position adjusting means as disclosed in, for example, such as Japanese Utility Model Application Laid-Open No. 54-124968 Specification has been proposed.

According to the above-described conventional screen printing machine, the machines uses, as a base board, a table 1 which is rotatable in a direction of $\theta$ on which is placed a substrate which is a material to be printed, as shown in FIG. 2. An X-Y moving means is constituted by a first moving base 2 for moving the table 1 in a direction of X, a first linear motion mechanism 3 for linearly guiding and moving the first moving base 2 in a direction of X, a second moving base 4 for moving the first moving base 2, which moves the table 1 in the direction of X, in a direction of Y, and a second linear motion mechanism 5 for linearly guiding and moving the second moving base 4 in a direction of Y. The table 1 is displaced along with the X-Y moving means in the direction of X, Y and $\theta$ whereby the adjustment of position of the substrate on the basis of an alignment mark provided on the substrate is accomplished.

The recognition means for the substrate position in the screen printing machine has been proposed which uses a recognition camera, as disclosed in, for example, such as Japanese Patent Application Laid-Open No. 57-75889 Specification.

However, the above-described substrate position adjusting means in the screen printing machine requires mechanisms which individually displace those as described above in the direction of X, Y and $\theta$, respectively, and in addition, said means is of a 3-layer construction. For this reason, the entire mechanism becomes large-sized to impede space-saving and light-weighting, and the rotational motion mechanism for the table becomes complicated in construction as compared with the linear motion mechanism.

On the other hand, the conventional substrate position recognition means in the screen printing machine uses only one unit of a recognition camera, and said camera is fixedly provided. Therefore, for confirmation of the position of a substrate on the table, there is only one check point, which results in the insufficient printing accuracy.

In view of the foregoing, two or more check points may be provided in order to improve the accuracy of printing as desired. However, this requires more than two recognition cameras, thus considerably increasing the cost of the machine.

SUMMARY OF THE INVENTION

The present invention is intended to overcome the above-described disadvantages with respect to the conventional screen printing machine. It is a first object of the present invention to provide a screen printing machine having a position adjusting means for carrying out adjustment of position of a material to be printed having a plurality of alignment marks in a direction of X, Y and $\theta$, said position adjusting means comprising a placing means for placing and positioning said material to be printed, a means for displacing said placing means in a direction of X and capable of moving said placing means from a recognition station to a printing station, and a means for displacing said placing means in a direction of Y, said means for displacing said placing means in a direction of Y being composed of a mechanism in which both side portions of said placing means are respectively independently slidable in a direction of Y. This arrangement eliminates the necessity of a rotational motion mechanism for a table, enables simple adjustment of position in a direction of X, Y and $\theta$ of a material to be printed, prevents dislocation of printing, simplifies the mechanism to enable inexpensiveness, small-size and light-weighting, and reduces a load on drive means.

It is a further object of the present invention to provide an arrangement which comprises a placing means for placing and positioning a material to be printed having a plurality of alignment marks, and a recognition means for recognizing the alignment marks on the material to be printed placed on said placing means, said recognition means being designed so that said recognition means, which is in the form of a single recognition camera adapted to be movable in a direction at right angles to the direction of transporting said material to be printed, reads a dislocated amount between the alignment marks of said material to be printed and a normal position, and a displacing means for said placing means may be driven and controlled according to a corrected amount caused by the dislocated amount. This enables confirmation of position of a material to be printed by means of an inexpensive means which is a single recognition camera to prevent dislocation of printing and enables printing in a normal position.

DETAILED DESCRIPTION OF THE INVENTION

A specific mode of a screen printing machine according to the present invention will be described hereinafter with reference to embodiments shown in FIGS. 1 and 2.

Figure 1:
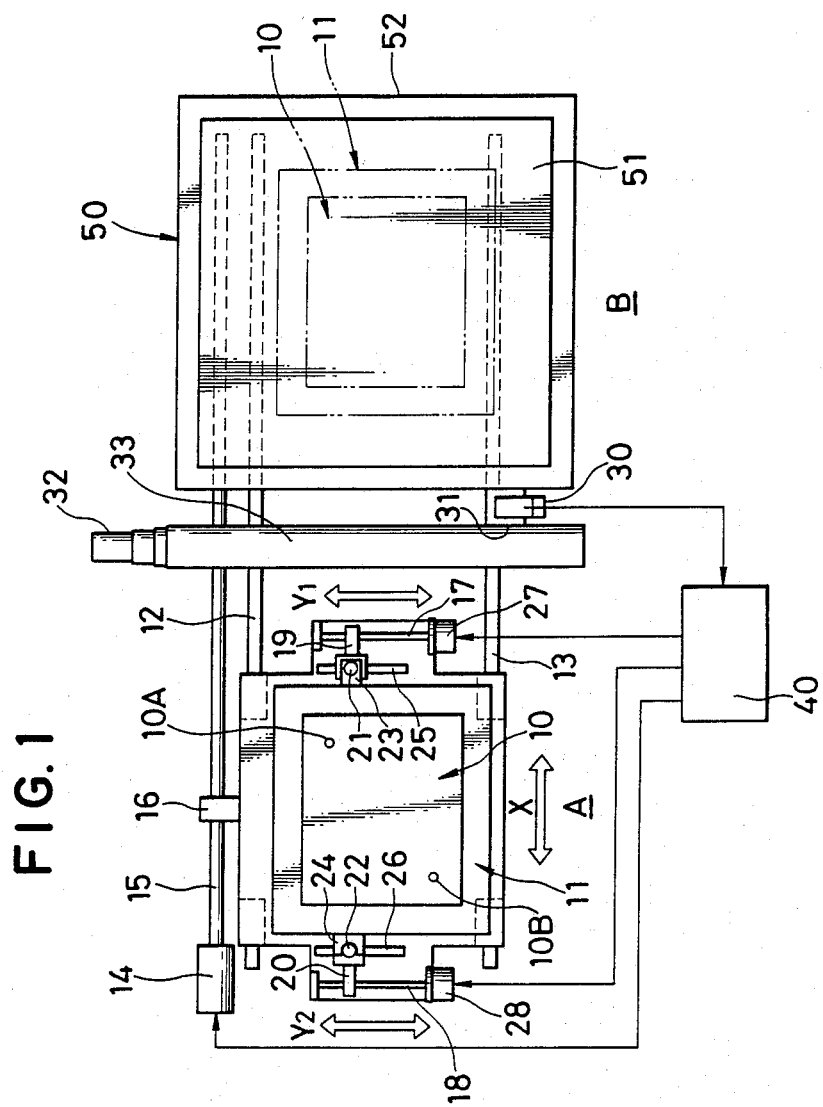
FIG. 1 is a plan view schematically showing an embodiment of a screen printing machine according to the present invention.
Figure 2:
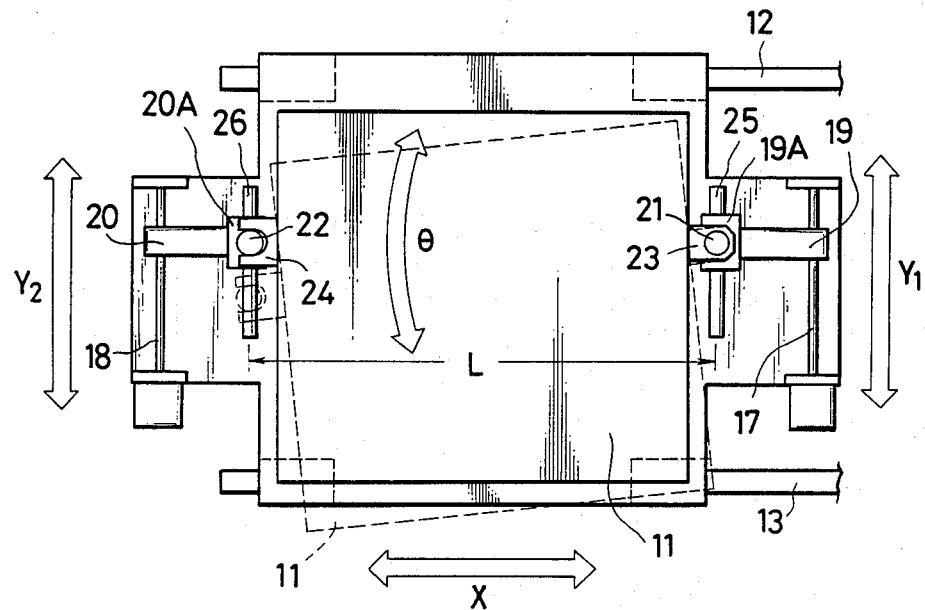
FIG. 2 is likewise a plan view schematically showing the operating state of a substrate position adjusting mechanism in a screen printing machine.
Figure 3:
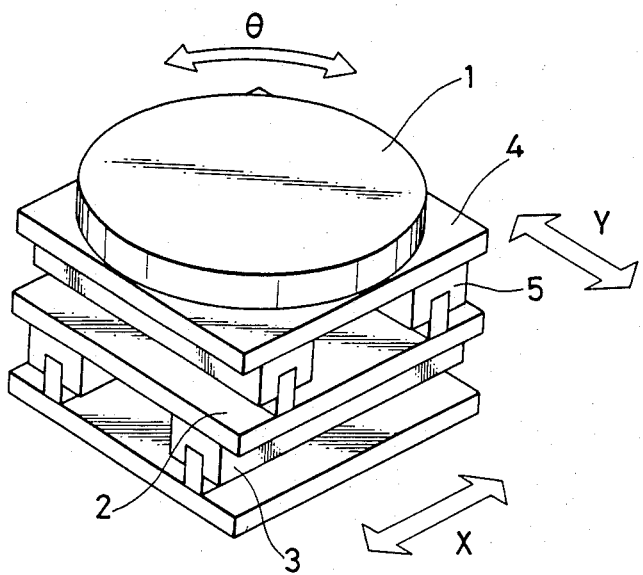
FIG. 3 is an external view schematically showing a drive mechanism for a table in a conventional screen printing machine.

As shown in FIG. 1, reference numeral 10 designates a substrate which is a material to be printed, for example, such as a substrate for a thick film integrated circuit, a print substrate, etc. This substrate 10 is of a rectangular shape, for example, and has a plurality of alignment masks 10A, 10B applied to corners on diagonal lines. The substrate 10 is being placed in an already positioned state on an attraction table 11 which is a placing means attracted by a vacuum pump not shown. An X-direction table constituting the attraction table 11 is movably arranged on a pair of front and rear guide rails 12, 13 disposed in a direction of X, each of which is a linear motion mechanism in a direction of X. The table 11 is further threadedly connected through a connection member 16 to an output shaft 15 in a direction of X formed with screws which is driven by an X-direction feed servo motor 14 arranged parallel to said one guide rail 12. By the normal or reverse rotation of the output shaft 15, the attraction table 11 is controlled to be moved in the direction of X from a positioning station A to a printing station B.

The attraction table 11 is connected to a pair of left and right first and second Y-direction output shafts 17, 18 disposed in a horizontal direction by means of a first and second support shaft members 19, 20 and a first and second fitting members 23, 24 supported on the first and second support shaft members 19, 20 through shafts 21, 22, which are secured to sliding portions 19A and 20A, respectively, of the first and second support shaft members 19, 20, while one of them is fitted rotatably in a horizontal direction ($\theta$). The first and second support shaft members 19, 20 are slidably disposed on a first and second Y-direction guide rails 25, 26. The other of the first and second fitting members 23, 24 is secured to both left and right side portions of a Y-direction table which constitutes the attraction table 11 and is arranged on said X-direction table. The shaft 22 is fitted into a second fitting member 24 with a play in an X-direction.

More specifically, the first support shaft member 19 causes, by the normal or reverse rotation of the first $Y_1$-direction output shaft 17 upon the drive of a first correcting servo motor 27, the right one side of the attraction table 11 to be moved in the direction of $Y_1$ and enables the same to be controlled for rotation in the direction of $\theta$ about the shaft 21, whereas the second support shaft member 20 causes, by the normal or reverse rotation of the second $Y_1$-direction output shaft 18 upon the drive of a second correcting servo motor 28, the left one side of the attraction table 11 to be moved in the direction of $Y_2$ and enables the same to be controlled for rotation in the direction of $\theta$ about the shaft 22. As indicated by the broken lines in FIG. 2, the attraction table 11 is rotated in the direction of $\theta$ about the shaft 21 or 22 according to a difference between the $Y_1$ direction and the $Y_2$ direction. These constituent members constitute a $\theta$-direction rotational motion mechanism while serving as a Y-direction linear motion mechanism to make the adjustment of position of the substrate 10 along with the aforementioned linear motion mechanism. The shaft 21 is completely fitted in the first fitting member 23, and the second fitting member 24 is formed with a notch in the outer portion thereof so as to provide a play when the former is in a state fitted in the shaft 22. Therefore, even in the case where the moving distances of the support shaft members 19, 20 are different and the distance between the shafts 21 and 22 is varied, the fitting state between the shaft 20 and the second fitting member 24 is varied in the range of said play, and the attraction table 11 may be rotated smoothly through $\theta$.

In the drawing, reference numeral 30 designates a single recognition camera. This recognition camera 10 is connected through a connection member 31 to a moving mechanism 33 which is moved in a direction of Y by the drive of a camera feed servo motor 32. The moving mechanism 33 is disposed directly above the aforementioned guide rails 12, 13 and is provided with an output shaft not shown which is rotated normally or reversely by the drive of the camera feed servo motor 32. The connection member 31 is threadedly connected to the output shaft thereby moving the recognition camera 30 in the direction (Y) perpendicular to the carrying direction (X) of the substrate 10.

The recognition camera 30 reads a dislocated amount between the alignment marks 10A, 10B marked on the substrate 10 and the normal position, and transmits its information to an NC (numerical control) device 40. The driving and controlling of the X-direction feed servo motor 14, the first correcting servo motor 27 and the second correcting servo motor 28 and the moving amount thereof are determined in accordance with the programs put into the NC device 40.

In the drawing, reference numeral 50 designates a printing screen, which is mounted at an upper position of the printing station on the right hand of the guide rails 12, 13, the printing screen 50 being composed of a screen plate 51, and a screen frame 52 surrounding the screen plate 51.

It is noted that the state shown in FIG. 1 is the state of the positioning station A which is the prestage in the recognition station. Since the recognition camera 30 and the moving mechanism 33 are not positioned above the substrate 10, no obstacle constitutes to replace and check parts such as the screen plate 51.

Next, the operation of the screen printing machine according to the present invention will be described. First, in the positioning station A, the substrate 10 having been carried by the unshown carrier mechanism is placed on the attraction table 11 and is positioned and attracted by the unshown positioning mechanism, after which the substrate 10 is allowed to be positioned below the recognition camera 30 by moving the attraction table 11 in the direction (X) so that the attraction table may arrive at the positioning station by the drive of the X-direction feed servo motor 14 which has a feed function as well as a correction function. At that time, the moving position of the attraction table 11 is preset to the position at which the alignment marks marked on the substrate 10 are designated by the NC device 40, that is, to the position directly below the recognition camera 30. Then, in this state, the recognition camera 30 is moved in the direction (Y) perpendicular to the carrying direction (X) of the substrate 10 by means of the moving mechanism 33 driven by the camera feed servo motor 32. The movement of the recognition camera 30 at that time reads a dislocated amount between the position of the alignment marks 10A, 10B on the substrate 10 and the normal position which should exist, and the thus read information is transmitted to the NC device 40 so as to be stored as fixed data. If there are present a plurality of alignment marks on the substrate 10, similar recognition operation is sequentially carried out.

The substrate 10 with the recognition completed by the recognition camera 30 in the manner as described above is driven by the X-direction feed servo motor 14 and transported to the printing station B together with the attraction table 11 till it reaches the corresponding position of the printing screen 50. At the same time, during such movement, arithmetic operation is conducted by means of a computer (CPU) not shown incorporated into the NC device on the basis of the result of the dislocated amount between the position of the alignment marks 10A, 10B on the substrate 10 and the normal position to separate a component into X, $Y_1$ and $Y_2$-direction corrected components. With respect to the Y- and $\theta$-directions among these corrected amounts, in the case where correction is made through y in the Y-direction and through $\theta_1$ in the $\theta$-direction, the corrected amount in the $Y_1$ direction is y and that in the $Y_2$ direction is $y_1 + L \tan \theta_1$ (L: distance between axes).

The X-direction feed servo motor 14, the first correcting servo motor 27 and the second correcting servo motor 28 are driven and controlled according to command of the NC device 40 on the basis of the X-, Y- and $\theta$-direction corrected amounts determined as described above to move and adjust the attraction table 11 so that the alignment marks 10A, 10B of the substrate 10 assume the normal position.

That is, the correction of the attraction table in the X-direction is accomplished during the movement thereof by controlling the X-direction feed servo motor 14. The correction of the attraction table in the Y- and $\theta$-directions is accomplished by moving the support shaft members 19, 20 along the Y-direction output shafts 17, 18 and the guide rails 25, 26 by both the servo motors 27, 28 and adjustably moving the attraction table 11 to the normal position through the fitting members 23, 24. In this case, the positional adjusting in the Y-direction can be made either during movement in the X-direction or after completion of the movement in the X-direction.

After the substrate 10 has been corrected, the attraction table 11 is moved upward by means of a lift mechanism not shown to position the substrate closely to the screen plate 51 of the printing screen 50, whereby screen printing having a fixed wiring pattern is applied to the substrate 10 by use of a squeegee not shown.

In the above-described embodiment, in the case where for example, there is present a relative positional dislocation between the printing screen 50 and the recognition camera 30, if a value of such dislocation is stored in advance in the NC device 40, it can be added to each of the corrected amounts.

While the X-direction feed servo motor 14, the first correcting servo motor 27 and the second correcting servo motor 28 are used as a drive source, it is to be noted that a pulse motor can be employed.

Furthermore, the calculation of the effective corrected amount in the $\theta$-direction of the attraction table 11 by the substrate position adjusting means according to the present invention can be made by, if the value of $\theta$ is small.

$$L \tan \theta \approx 2 L \sin (\theta/2) \approx L\theta$$

which can be handled as an approximation. Therefore, $\theta$ is of the order of $\pm 5°$. In this case, the corrected amount in the $\theta$-direction of the screen printing will be sufficient if it is less than $\pm 5°$. Thus, the correction in the $\theta$-direction is made possible by the mechanism described in the embodiments of the present invention.

What is claimed is:

1. A screen printing machine for carrying out adjustment of position in a direction of X, Y and $\theta$ of a material to be printed prior to printing, comprising
    placing means having an X-direction table and a Y-direction table disposed on said X-direction table, placing said material to be printed to effect positioning at a positioning station;
    carrying means for moving and carrying said placing means while placing a print substrate thereon linearly in an X-direction through a guide member from said positioning station to said printing station through a recognition station;
    recognition means for recognizing alignment marks (S) of the material to be printed on said placing means having been carried from said positioning station to the recognition station by said carrying means, said recognition means capable of being moved by means of a moving mechanism only in a Y-direction perpendicular to the carrying direction of said material to be printed;
    displacing means capable of displacing both sides of the Y-direction table of said placing means separately in a Y-direction on the basis of recognition result obtained by said recognition means designed so that the alignment marks (S) on said material to be printed can be recognized by the movement of said placing means in an X-direction caused by said carrying means and the movement of said recognition means in a Y-direction caused by said moving mechanism, thereby correcting a deviation of said placing means in a Y-direction and in $\theta$-direction;
    means for controlling said carrying means so that a deviation of the X-direction table of said placing means in an X-direction is corrected on the basis of recognition result obtained by said recognition means; and
    printing means disposed on the printing station apart in an X-direction from said recognition means to screen-print the material to be printed on the placing means having been carried by said carrying means through a screen place by use of a squeegee, said displacing means comprises
    a pair of guide members parallel to each other in the Y-direction;
    support shaft members independently slidable in the Y-direction of said guide members;
    first and second shafts positioned substantially upright on said support shaft members;
    a first fitting member supported on one of said support shaft members so that said fitting member being rotatable in a horizontal direction about said first shaft, said first fitting member being provided on one side of said placing means; and
    a second fitting member into which said second shaft is fitted with a play in an X-direction, said second fitting member being provided on the other side of said placing means.

2. A screen printing machine according to claim 1, wherein said control means controls a feed amount in consideration of a deviation of said placing means in an X-direction on the basis of recognition result obtained by said recognition means when said placing means is carried from the recognition station to the printing station.

* * * * *